(12) United States Patent
Matsuura

(10) Patent No.: US 6,225,686 B1
(45) Date of Patent: *May 1, 2001

(54) SEMICONDUCTOR DEVICE

(75) Inventor: Masao Matsuura, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/974,348

(22) Filed: Nov. 19, 1997

(30) Foreign Application Priority Data

Nov. 21, 1996 (JP) .................................................... 8-309836

(51) Int. Cl.$^7$ ................................................. H01L 23/495
(52) U.S. Cl. ........................................... 257/668; 257/774
(58) Field of Search ................................... 257/673, 668, 257/774; 361/761

(56) References Cited

U.S. PATENT DOCUMENTS

| | | | |
|---|---|---|---|
| 4,209,355 | * 6/1980 | Burns | 156/630 |
| 4,251,852 | * 2/1981 | Ecker et al. | 257/712 |
| 5,130,889 | * 7/1992 | Hamburgen et al. | 361/388 |
| 5,216,278 | * 6/1993 | Lin et al. | 257/688 |
| 5,258,647 | * 11/1993 | Wojnarowski et al. | 257/704 |
| 5,409,865 | * 4/1995 | Karnezos | 437/210 |
| 5,561,323 | * 10/1996 | Andros et al. | 257/707 |
| 5,583,377 | * 12/1996 | Higgins, III | 257/707 |
| 5,814,883 | * 9/1998 | Sawai et al. | 257/712 |

* cited by examiner

*Primary Examiner*—Wael Fahmy
*Assistant Examiner*—Roy Potter
(74) *Attorney, Agent, or Firm*—Sonnenschein, Nath & Rosenthal

(57) ABSTRACT

A semiconductor device including a semiconductor chip having plural electrode pads at the peripheral edge portion thereof, a frame-shaped package substrate in which the semiconductor chip is mounted and which has plural electrode portions corresponding to the respective electrode pads, a lead terminal for connecting each of the electrode pads of the semiconductor chip and each corresponding electrode portion of the package substrate, and sealing resin for sealing the semiconductor chip. In a method of manufacturing the semiconductor device, a lead terminal is connected to each of plural electrode pads of a semiconductor chip while setting a lead connection angle in accordance with the chip size, the lead terminal is cut to a predetermined length in accordance with an electrode forming position of the frame-shaped package substrate on which the semiconductor chip can be mounted, the cut portion of the lead terminal is connected to the electrode portion of the package substrate while the semiconductor chip is mounted on the package substrate, and then the semiconductor chip mounted on the package substrate is sealed with sealing resin.

13 Claims, 11 Drawing Sheets

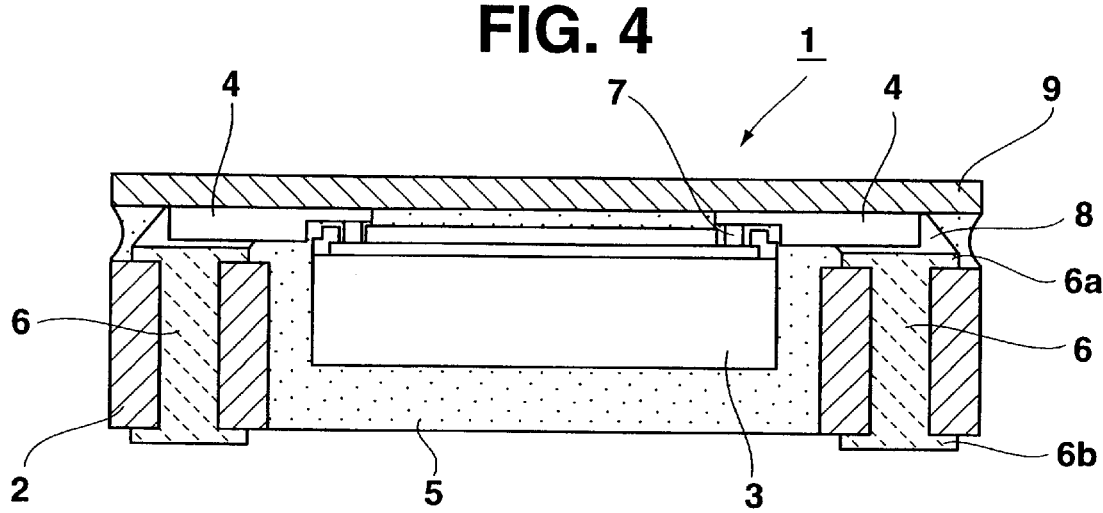
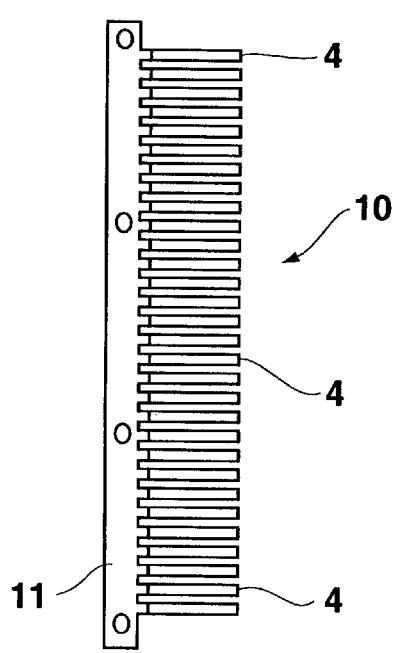
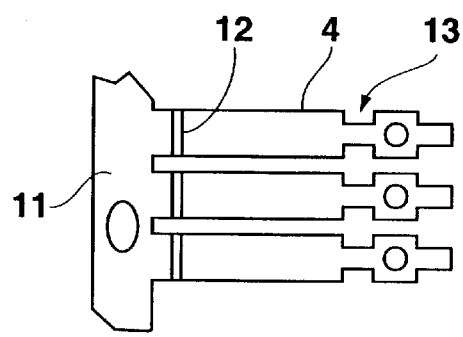
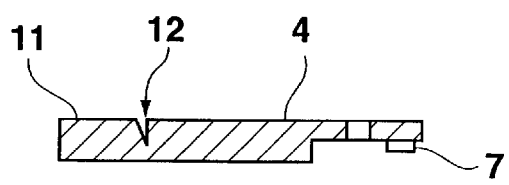

SEMICONDUCTOR DEVICE

BACKGROUND OF THE INVENTION

1. Field of the Invention

The present invention relates to a semiconductor package having such a structure that a package substrate and a semiconductor chip are coupled to each other.

2. Description of Related Art

A COX (Chip On X) structure in which a bare semiconductor chip is directly mounted on a wiring board has been generally known as a semiconductor package structure using a bare technique. The COX structure is mainly classified into a structure based on a flip chip bonding technique and a structure based on a wire bonding technique.

FIGS. 1A and 1B show a conventional semiconductor package structure based on the flip chip bonding technique. More specifically, FIG. 1A is a cross-sectional view of the semiconductor package structure, and FIG. 1B is a plan view of the semiconductor package structure.

In the semiconductor package shown in FIGS. 1A and 1B, a semiconductor chip 51 is put face down on a package substrate 50 serving as a base. A bump 52 serving as a chip electrode is formed on the surface (the lower surface in the figures) of the semiconductor chip 51, and the semiconductor chip 51 and the package substrate 50 are electrically and mechanically connected to each other through the bump 52. Further, a wiring pattern 53 is formed on the chip-mounted surface (the upper surface in the figures) of the package substrate 50, and an embedded through hole is formed at the pattern end portion of the wiring pattern 53.

According to the package structure as described above, even when the size of the semiconductor chip 51 is varied, the same-size package substrate 50 may be used commonly to these semiconductor chips having different sizes by forming the wiring pattern 53 in accordance with the chip size of each semiconductor chip.

FIG. 2 is a cross-sectional view showing the conventional structure of a semiconductor package based on the wire bonding technique.

In the semiconductor package shown in FIG. 2, a semiconductor chip 61 is put face up on a package substrate 60 serving as a base. A chip electrode (not shown) is formed on the surface of the semiconductor chip 61, and the chip electrode is electrically connected to an embedded through hole electrode 63 of the package substrate 60 through a wire 62 such as a metal wire or the like.

In the package structure, even when the size of the semiconductor chip 61 is varied, the same-size package substrate 60 may be used commonly to these semiconductor chips having different sizes by performing wire bonding in accordance with the chip size.

However, the conventional semiconductor package has the following problems.

First, in the case of the semiconductor package shown in FIG. 1, the electrode position (bump position) is varied in accordance with the size of the semiconductor chip 51. Therefore, when semiconductor chips 51 having the same number of electrodes are mounted, for example when a semiconductor chip 51 which is smaller in size than described above as shown in FIG. 3A is mounted, a package substrate 50 having a wiring pattern 53 which is matched with the semiconductor chip 51 must be prepared. Accordingly, even when semiconductor chips 51 have the same number of electrodes, a package substrate 50 which is exclusive to each size of semiconductor chip must be prepared, and it greatly obstructs standardization of parts.

Further, in the case of the semiconductor package shown in FIG. 2, the bonding length which is required to keep proper wire bonding quality, that is, a fixed permissible range is given to the horizontal distance BL between the bonding position at the chip side and the bonding position at the substrate side. Therefore, if the horizontal distance exceeds the permissible range, for example when the bonding length BL is excessively short as compared with the chip size shown in FIG. 3B, the wire 63 comes into contact with the chip edge to induce a short-circuit failure. Conversely, when it is excessively long, there occurs such a disadvantage that the wire 62 is hung down. Accordingly, a limitation is imposed on the chip size of semiconductor chips which can be mounted on the same-size package substrate 60. Further, when inner coat agent 64 having a large contraction rate is provided as show in FIG. 3C, the wire 62 is greatly deformed due to the contraction of the inner coat agent in the progress of the hardening of the inner coat agent, so that a limitation is also imposed on selection of materials.

In addition, each of the semiconductor packages shown in FIGS. 1A and 1B and FIG. 2 has such a structure that the semiconductor chip 51 (61) is mounted on the package substrate 50 (60), and thus the thickness of each part is added, so that the total thickness of the overall package is large. Accordingly, these semiconductor packages cannot support a compact and low-profile design for semiconductor packages which will be required in the future.

SUMMARY OF THE INVENTION

A first object of the present invention is to implement a compact and low-profile design for semiconductor packages.

A second object of the present invention is to standardize package substrates of semiconductor packages.

In order to attain the above object, a semiconductor device according to the present invention includes a semiconductor chip having plural electrode pads at the peripheral edge portion thereof, a frame-shaped package substrate in which the semiconductor chip is mounted and which has plural electrode portions corresponding to the respective electrode pads, a lead terminal for connecting each of the electrode pads of the semiconductor chip and the corresponding electrode portion of the package substrate, and sealing resin for sealing the semiconductor chip.

In the above-described semiconductor device, the semiconductor chip is mounted in the frame of the frame-shaped package substrate, and thus the thickness of the overall package can be reduced by the amount corresponding to the thickness of the semiconductor chip as compared with the prior art.

Further, a semiconductor device manufacturing method according to the present invention includes a first lead connecting step of connecting a lead terminal to each of plural electrode pads of a semiconductor chip which has the plural electrode pads at the chip peripheral edge portion while setting a lead connection angle in accordance with the chip size, a lead cutting step of cutting the lead terminal by a predetermined length in accordance with an electrode forming position of the frame-shaped package substrate on which the semiconductor chip can be mounted, a second lead connecting step of connecting the cut portion of the lead terminal to the electrode portion of the package substrate while the semiconductor chip is mounted on the package substrate, and a resin sealing step of sealing the semiconductor chip mounted on the package substrate with sealing resin.

According to the semiconductor device manufacturing method, in the first lead connection step, each lead terminal is connected to each electrode pad while keeping the lead connection angle in accordance with the size of the semiconductor chip, and in the subsequent lead cutting step the lead terminal is cut by a predetermined length in accordance with the electrode forming position of the package substrate. Therefore, each of semiconductor chips which are different in size can be mounted on each of common package substrates with no trouble by merely changing the lead connection angle in the first lead connecting step and the lead cutting length in the lead cutting step in accordance with the size of each of various semiconductor chips.

BRIEF DESCRIPTION OF THE DRAWINGS

FIG. 4 is a cross-sectional view showing a semiconductor package according to an embodiment of the present invention;

FIGS. 5A to 5C show the construction of a terminal array;

DETAILED DESCRIPTION OF THE PREFERRED EMBODIMENT

A preferred embodiment according to the present invention will be described with reference to the accompanying drawings.

FIG. 4 is a cross-sectional view showing a semiconductor package according to the present invention.

Figure 1A:
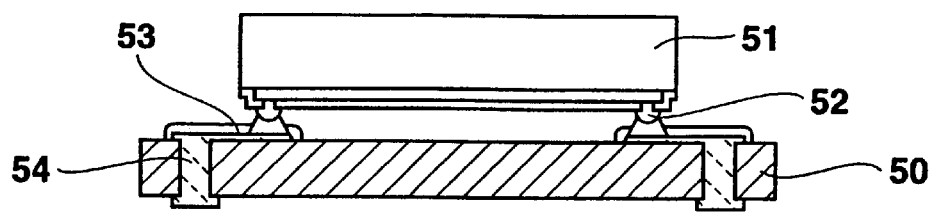
FIGS. 1A and 1B are diagrams showing a conventional package structure.
Figure 1B:
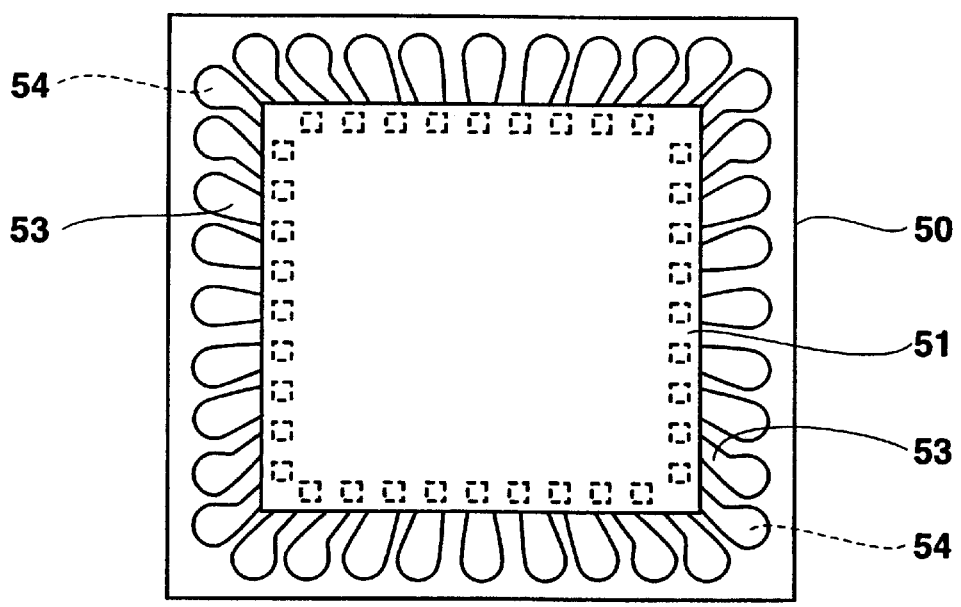
Figure 2:
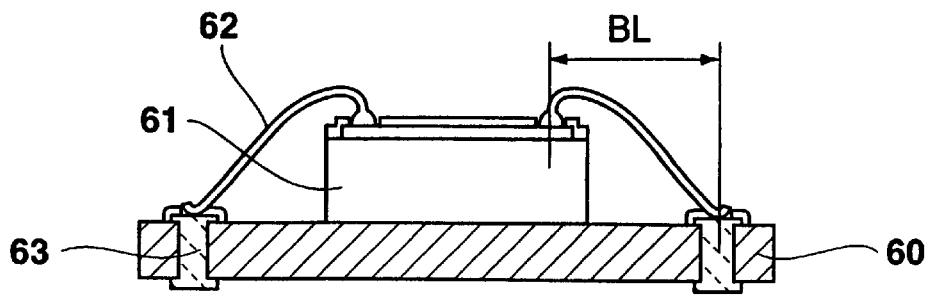
FIG. 2 is a diagram showing another conventional package structure.
Figure 3A:
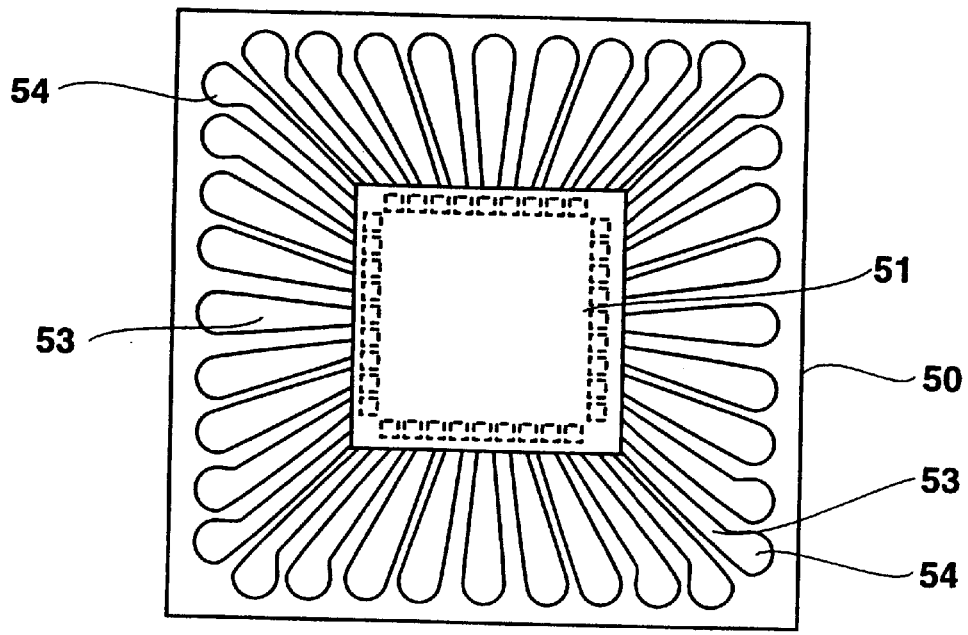
FIGS. 3A, 3B and 3C are diagrams showing the conventional package structure to explain the problem thereof.
Figure 3B:
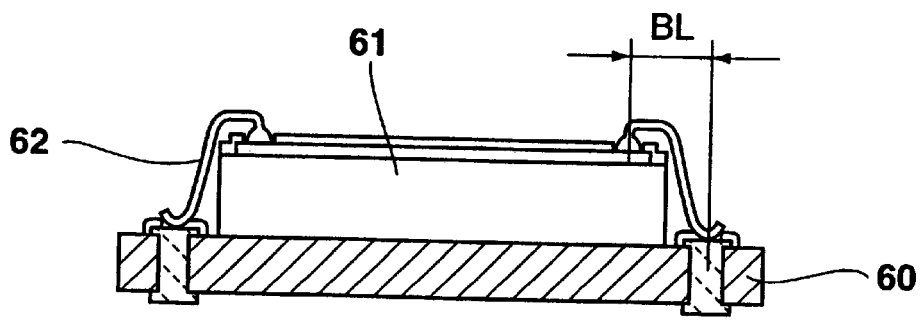
Figure 3C:
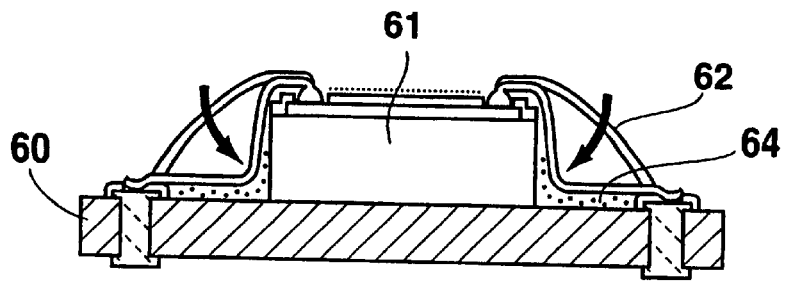

A semiconductor package 1 of the embodiment shown in FIG. 1 mainly includes a package substrate 2 serving as a base, a semiconductor chip 3 serving as an active element, plural lead terminals 4 for electrically connecting the package substrate 2 and the semiconductor chip 3, and sealing resin 5 for sealing the semiconductor chip 3.

The package substrate 2 is designed in a rectangular frame shape which is matched with the outer shape of the semiconductor chip 3. The in-frame dimension of the package substrate 3 is set to be larger than the outer dimension of the semiconductor chip 3 so that the semiconductor chip 3 can be mounted (accommodated) in the frame. The package substrate 2 is provided with embedded through holes 6 at the position at which terminals of the completed package will be located, one end portion of each of the embedded through holes 6 serving as an electrode portion 6a for connection to leads while the other end portion serves as an electrode portion 6b for connection to the external. Any material such as organic base material such as glass epoxy or the like, inorganic base material such as ceramics or the like may be used as the material for the substrate.

The semiconductor chip 3 has plural electrode pads (not shown) at the peripheral edge portion of the chip, and it is mounted in the frame of the package substrate 2. The electrode pads of the semiconductor chip 3 are located substantially at the same height as the electrode portions 6a of the package substrate 2, and the semiconductor chip is mounted so that the back surface (non-circuit forming surface) of the semiconductor chip is recessed more inwardly than the electrode portions 6b for the external connection of the package substrate 2.

The lead terminal 4 is bridged between the package substrate 2 and the semiconductor chip 3, and one end thereof is connected to the electrode pad (not shown) of the semiconductor chip 2 through a bump 7 while the other end thereof is connected to the electrode portion 6a of the package substrate 2 by a joint material 8 which is formed of soldering paste, silver paste or the like.

The sealing resin 5 is formed of epoxy resin, silicone resin or the like, and it is filled around the semiconductor chip 3 so as to contain each connection place of the lead terminals 4 to the package substrate 2 and the semiconductor chip 3. Further, a sealing plate 9 of about several tens $\mu$m in thickness is laminated on the upper surface of the semiconductor chip 3 through the lead terminals 4. The sealing plate 9 is used to prevent the sealing resin 3 from leaking to the outside of the package during the process of sealing the semiconductor chip 3 with the sealing resin 3.

In the semiconductor package 1 thus constructed, the package substrate 2 serving as the base is used as a frame, and the semiconductor chip 3 is mounted (accommodated) in the frame. Therefore, the thickness of the semiconductor chip 3 is not added to the thickness of the overall package. Accordingly, the thickness of the overall package can be suppressed to the same level or amount as the thickness of the package substrate 2, so that the thickness of the package can be reduced by the amount corresponding to the chip thickness as compared with the conventional structure. Further, the lead terminals 4 has a higher mechanical strength (rigidity, etc.) than wires of metal or the like, so that the degree of freedom of selection of materials such as sealing material, etc. can be more enhanced.

Next, a method for manufacturing the semiconductor package according to the present invention will be described.

In the process of manufacturing the package, a terminal array 10 as shown in FIG. 5A is first prepared. The terminal array 10 is formed of copper or copper alloy as base material, and it has such a structure that a predetermined number of lead terminals 4 (the predetermined number is set to the number corresponding to one package) are integrally linked to each other through a longitudinal link piece 11.

These lead terminals 4 are arranged at fixed pitches in the longitudinal direction of the link piece 11, and a separating notch 12 is provided at the link portion of each lead terminal 4 to the link piece 11 as shown in FIG. 5B. Further, as shown in FIG. 5C, a bump 7 is provided at the tip of each lead terminal 4.

Further, a thinned portion 13 is provided in the neighborhood of the bump 7 at the tip of each lead terminal 4. The thinned portion 13 is formed by partially thinning each lead terminal 4 (partially reducing the terminal width) in order to prevent deterioration of the connection strength of the bump 7 to the electrode pad in the form of a finished package, and it serves to absorb thermal stress and acts as a hook portion to the sealing resin 5 so that it has an anchor effect. In addition, a predetermined step is formed at the tip portion of each lead terminal 4 to avoid the contact with the chip edge when the lead connection to the semiconductor chip 3 is performed.

Figure 6:
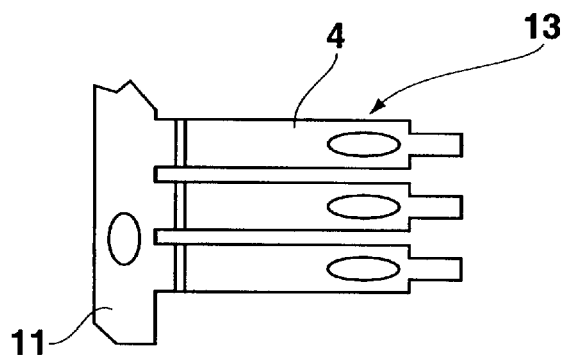
FIG. 6 is a diagram showing another terminal array.

In place of the above construction of the terminal array 10, an elongated hole may be provided as a microprocessed portion 13 at the tip side of each lead terminal 4 as shown in FIG. 6.

Figure 7A:
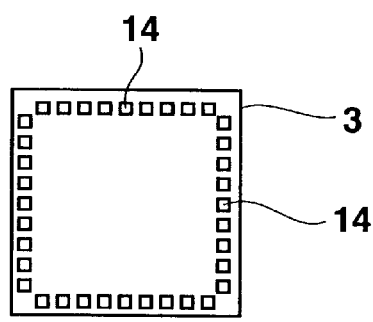
FIGS. 7A and 7B are diagrams (part 1) showing a first lead connection step.
Figure 7B:
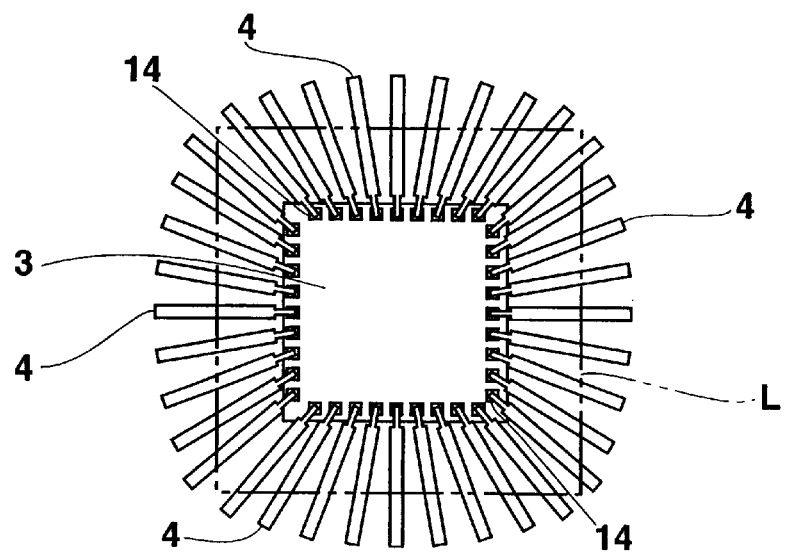

When the terminal array 10 thus constructed is prepared, each of the lead terminals 4 of the terminal array 10 are connected to the bare semiconductor chip 3 shown in FIG. 7A. Plural electrode pads (aluminum pads) 14 are provided at predetermined pitches at the peripheral edge portion of the semiconductor chip 3, and each of the lead terminals 4 of the terminal array 10 is connected to each of the electrode pads 14 one by one, thereby obtaining an intermediate state as shown in FIG. 7B.

Figure 8:
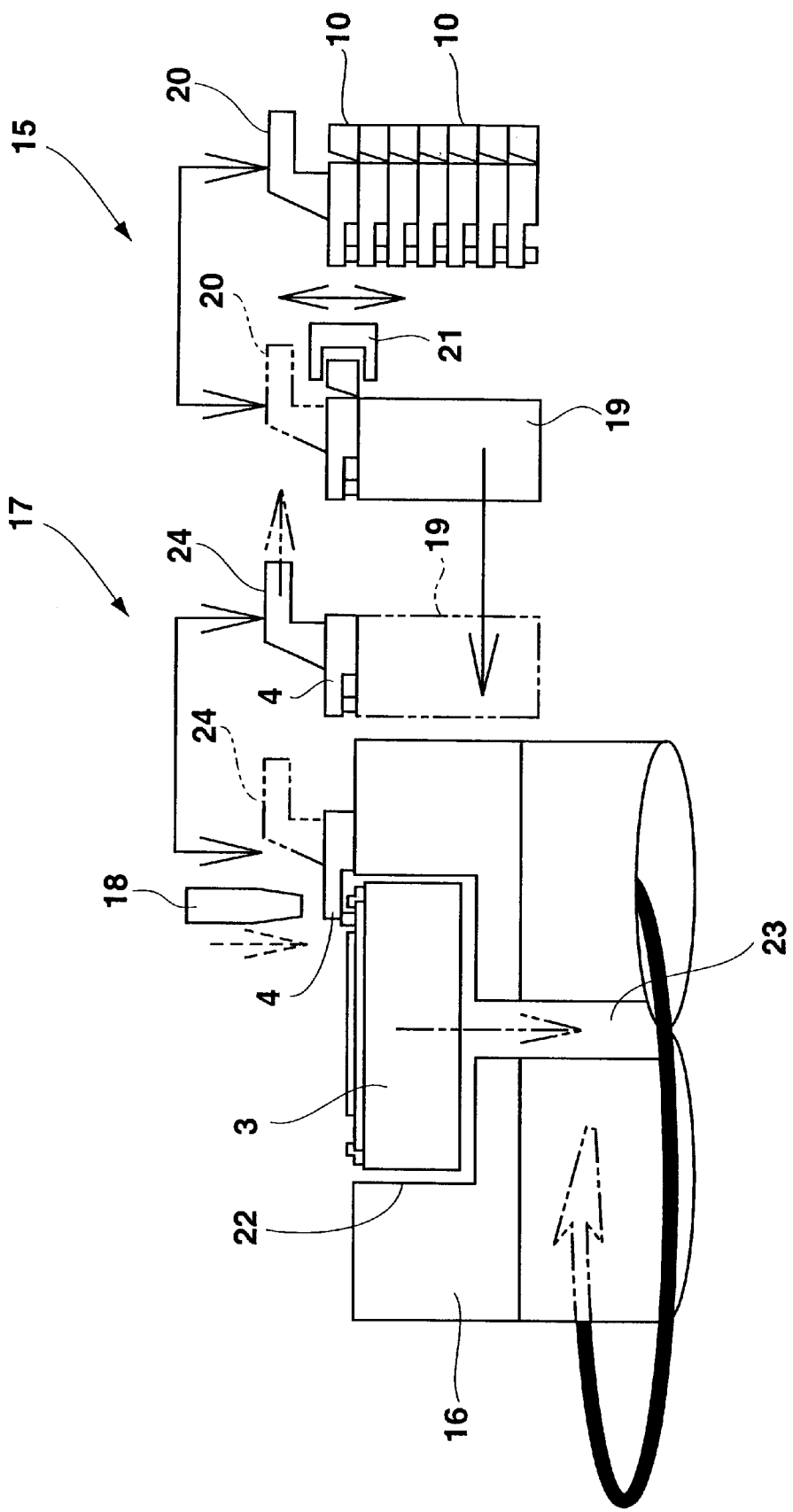
FIG. 8 is a schematic side view showing a lead connection device using the first lead connecting step.
Figure 9:
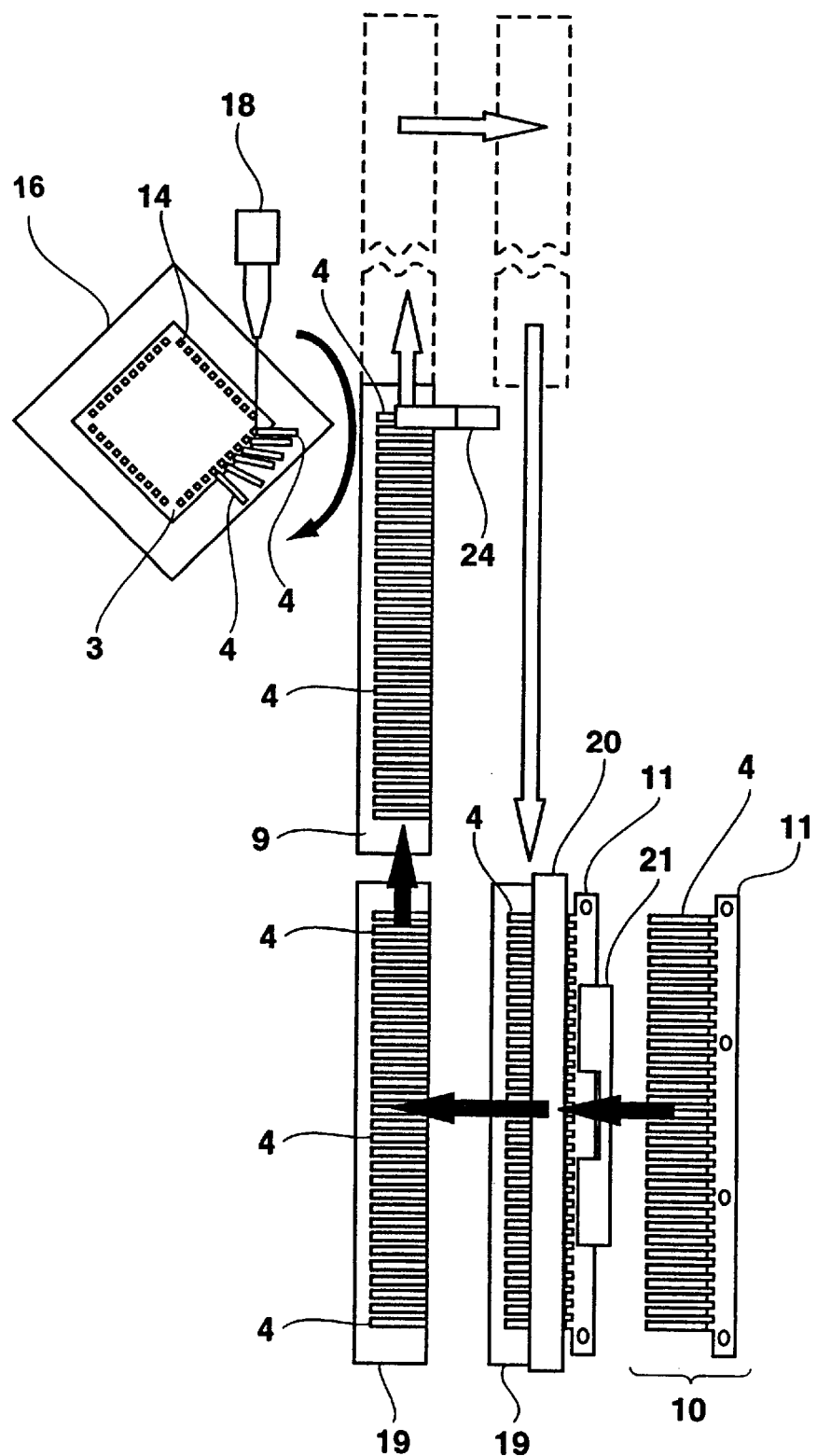
FIG. 9 is a plan view showing the lead connection device using the first lead connecting step.

Here, this embodiment newly uses a lead connecting device as shown in FIGS. 8 and 9 when the lead terminals 4 are connected to the semiconductor chip 3.

The lead connecting device includes a lead separating unit 15 for separating the respective lead terminals 4 linked to the terminal array 10 into individual pieces, a bonding stage 16 for holding the semiconductor chip 3, a lead supply unit 17 for supplying the bonding stage 16 with each of the lead terminals which are separated by the separating unit 15, and a bonding tool 18 for the lead connection.

The lead separating unit 15 includes an array feeding collet 20 for picking up the terminal arrays 10 laminated and stocked at plural stages one by one and placing each terminal array on a separating stage 19, and a bending jig 21 for separating the lead terminal 4 from the terminal array 10 which is placed on the separating stage 19.

The bonding stage 16 is supported by a stage driving system (not shown) so as to be rotatable and horizontally displaceable. A recess portion 22 in which the semiconductor chip 3 is positioned and mounted is provided at the center of the bonding stage 16, and the semiconductor chip 3 is gripped by a under vacuum through a vacuum hole 23 intercommunicating with the recess portion 22 while the semiconductor chip 3 is positioned.

The lead supply unit 17 includes a lead feeding collet 24 for picking up the lead terminals 4 separated on the separating stage 19 one by one, and placing it onto the bonding stage 16.

The bonding tool 18 is supported by a tool driving system (not shown) so as to be movable upwardly and downwardly, and in the lead connection process, the lead terminals 4 are connected one by one by using pressure, heat and ultrasonic vibration in combination.

Next, the operation of the lead connecting device thus constructed will be described.

The terminal array 10 which is laminated at the topmost stage is picked up from the plural terminal arrays 10 stocked in the lead separating unit 15 by the array feeding collet 20, and then placed on the separating stage 19.

Subsequently, the bending jig 21 is engagedly inserted into the link piece 11 side of the terminal array 10 while the terminal array 10 is pressed and held down by the array feeding collet 20 and the separating stage 19. The bending jig 21 is moved downwardly in this state to apply shear force to the notch portions 12 of the terminal array 10 to separate the link piece 11 from the terminal array 10 and separate the respective lead terminals 4 into individual pieces.

After the separation of the lead terminals 4 as described above, the array feeding collet 20 is returned to the original position to pick up a next terminal array 10. Further, the separation stage 19 on which individual lead terminals 4 are mounted is temporarily moved forwardly, and then moved laterally so that the lead terminal 4 at the end of the array is located beneath the lead feeding collet 24. During this process, at the bonding stage 16 side, the semiconductor chip 3 which is a connection target is positioned and fixed in the recess portion 22 and then the process is on standby.

Subsequently, the lead feeding collet 24 is downwardly moved to pickup the lead terminal 4 at the end of the array, and places the pickup lead terminal on the bonding stage 16. At this time, the tip portion of the lead terminal 4 is superposed on the electrode pad 14 of the semiconductor chip 3. Subsequently, the bonding tool 18 is downwardly moved, and brought into contact with the upper surface of the lead terminal 4 under pressure to connect the tip portion of the lead terminal 4 to the electrode pad 14 through the bump 7 while applying ultrasonic vibration to the contact portion thereof.

When the connection of the first lead terminal 4 is finished, the lead feeding collet 24 is returned to the separation stage 19. At this time, a next terminal 4 is located beneath the lead feeding collet 24 by the lateral displacement of the separation stage 19 in accordance with the lead arrangement pitch. Therefore, the lead feeding collet 24 picks up the lead terminal 4 which is located just below the lead feeding collet 24, and supplies it to the bonding stage 19 again. During this process, the rotating operation and the horizontally moving operation of the stage are performed by the stage driving system at the side of the bonding stage 16, and an electrode pad 14 to be next connected is located beneath the bonding tool 18. Subsequently, each lead terminal 4 is successively connected to each corresponding electrode pad 14 in the same manner.

Figure 10:
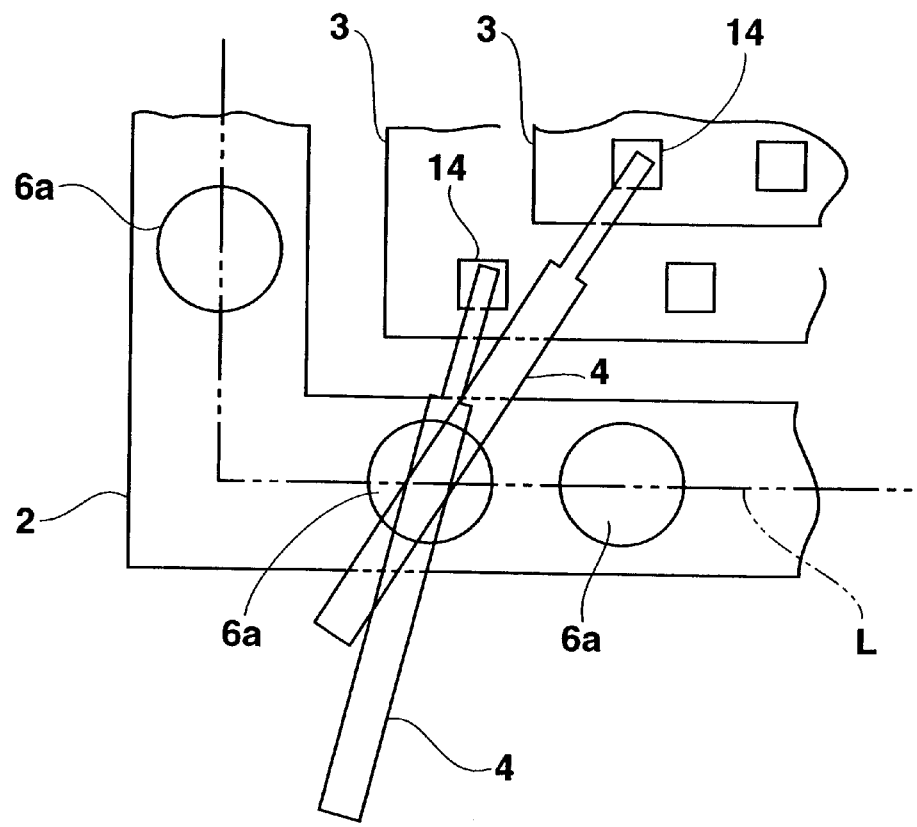
FIG. 10 is a diagram (part 2) showing the first lead connection step.

In this case, each lead terminal 4 is connected to each electrode pad 14 at a lead connection angle which is matched with the size of the semiconductor chip 3. Specifically, as shown in FIG. 10, even when the size of the semiconductor chip 3 is varied, the bonding stage 16 is rotated so that each electrode pad 14 and each corresponding electrode portion 6a of the package substrate are located on the same line and the corresponding lead terminal 4 is located on the line. Further, the horizontal distance from the center of the semiconductor chip 3 (the rotational center of the bonding stage 19) to each electrode pad 14 is shortest at the center of each side of the semiconductor chip 3 and it is gradually longer as the position of the electrode pad 14 is approached to each corner portion. Therefore, the bonding stage 16 is horizontally shifted so as to offset the variation of the horizontal distance as described above.

Control data which are required to control the rotation and the horizontal movement of the bonding stage 16 are stored in a control system of the lead connecting device in advance. Specifically, the coordinates of the electrode portions 6a of the package substrate 2 (position data) are set as reference values (constant values), chip electrode coordinate information is stored for every chip type, and the information corresponding to the semiconductor chip 3 to be actually handled is selected to indicate a connection angle.

Figure 11A:
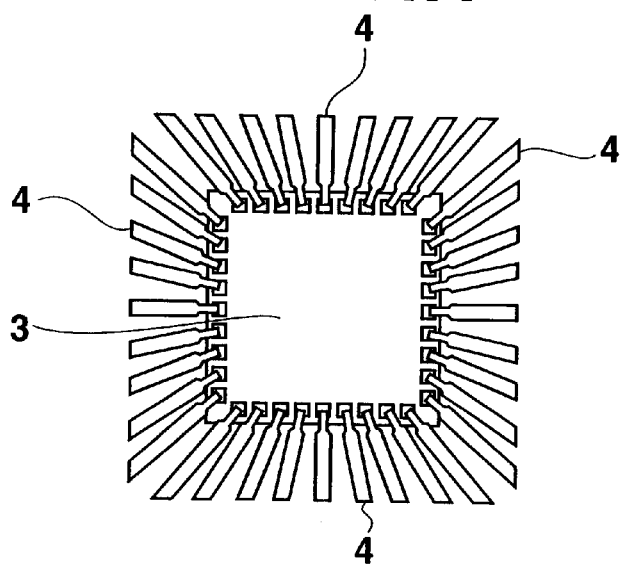
FIGS. 11A and 11B are diagrams showing a lead cutting step.
Figure 11B:
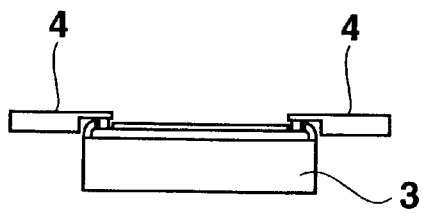

At the stage where each lead terminal 4 is connected to each corresponding electrode pad 14 over the four sides of the semiconductor chip 3, plural lead terminals 4 are radially arranged at the peripheral edge portion of the semiconductor chip 3 as shown in FIG. 7B. In this state, the length of each lead terminal 4 is longer than that of the completed package. Therefore, each lead terminal 4 is cut to a predetermined length in accordance with the position of the electrode portion 6a of the package substrate 2. Specifically, the portion of each lead terminal 4 which extends outwardly from the peripheral edge portion of the semiconductor chip 3 is cut off by a laser cutter or the like so that the tip portion of each lead terminal 4 is located at a virtual connection line L which connects the electrode portions 6a of the package substrate 2 (see FIGS. 7A and 10), whereby the cut portions 4a of the lead terminals 4 which extend from the peripheral edge portion of the semiconductor chip 3 is linearly aligned with one another as shown in FIGS. 11A and 11B.

Figure 12A:
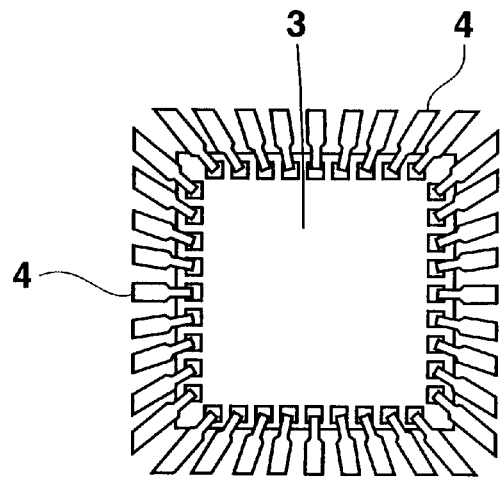
FIGS. 12A and 12B are diagrams showing variation of lead length in accordance with the chip size.
Figure 12B:
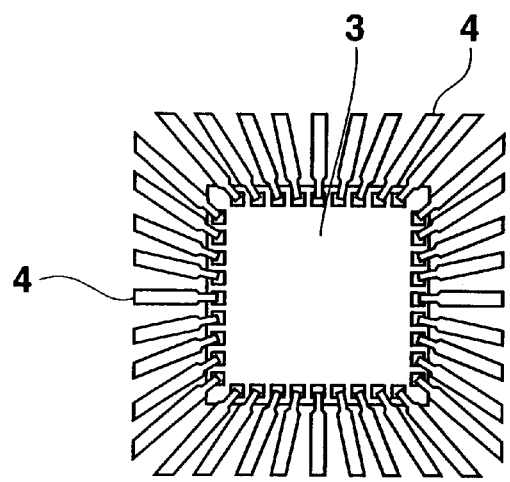

In the cutting process of the lead terminals 4, all the lead terminals 4 can be cut off on the same line on the basis of the electrode position of the package substrate 2 irrespective of the size of the semiconductor chip 3. Therefore, as compared between semiconductor chips having different sizes as shown in FIGS. 12A and 12B, the final lead length of the semiconductor chip 3 having a larger chip size is shorter than that of the semiconductor chip 3 having a smaller chip size.

Figure 13:
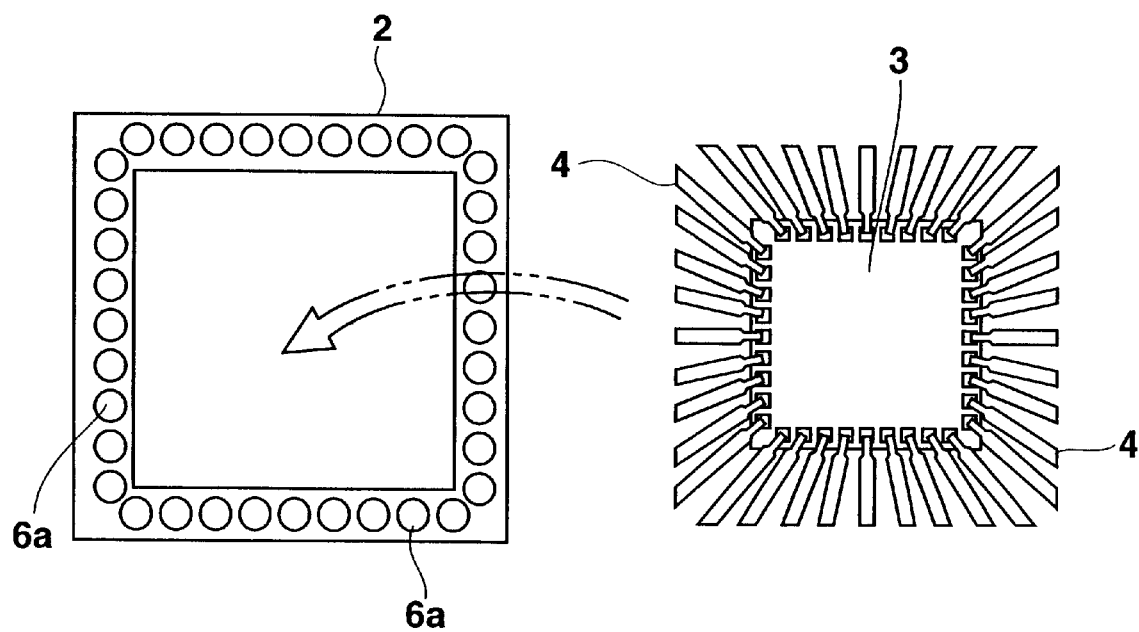
FIG. 13 is a diagram (part 1) showing a second lead connecting step.
Figure 14A:
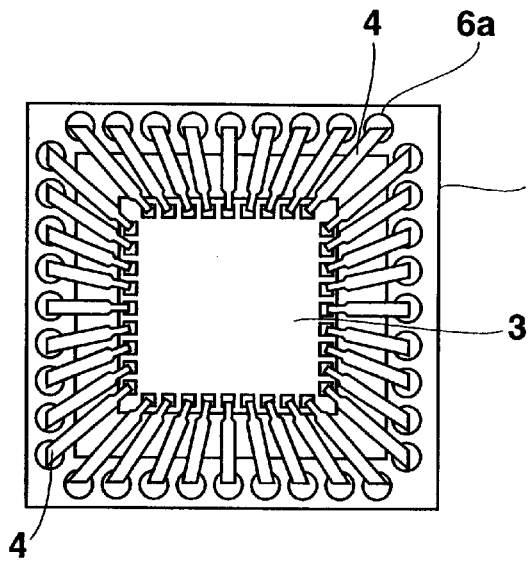
FIGS. 14A and 14B are diagrams (part 2) showing the second lead connecting step.
Figure 14B:
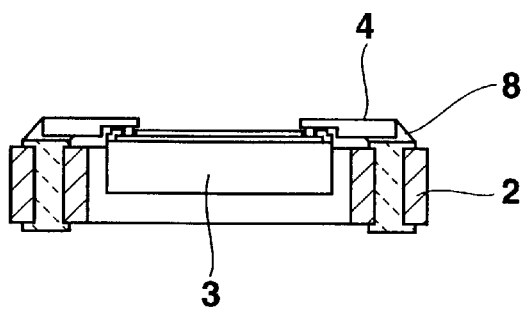

Subsequently, as shown in FIG. 13, the semiconductor chip 3 which has been subjected to the lead cutting process is mounted inside of the frame-shaped package substrate 2 having plural electrode portions 6a comprising embedded through holes. In this case, the electrode portions 6a of the package substrate 2 are beforehand coated with coupling material such as soldering paste or the like, then the tip (cut portion) of each lead terminal 4 is overlapped with the corresponding electrode portion 6a of the package substrate 2 through the coupling material, and then a heating treatment is conducted to connect the tip of the lead terminal 4 to the electrode portion 6a, whereby the package substrate 2 and the semiconductor chip 3 are electrically and mechanically connected to each other through the plural lead terminals 4 as shown in FIGS. 14A and 14B.

Figure 15A:
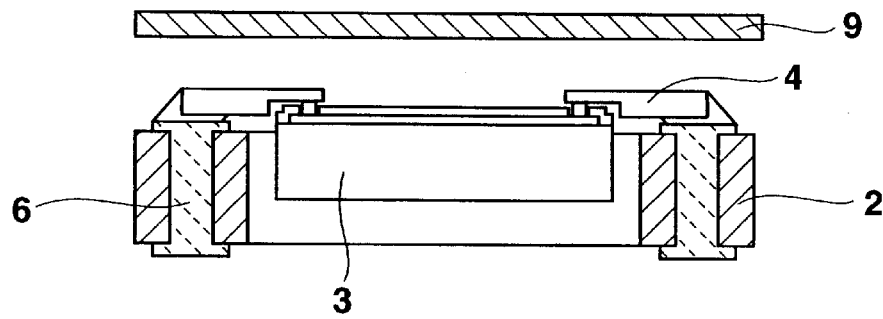
FIGS. 15A and 15B are diagrams (part 1) showing a resin sealing step.
Figure 15B:
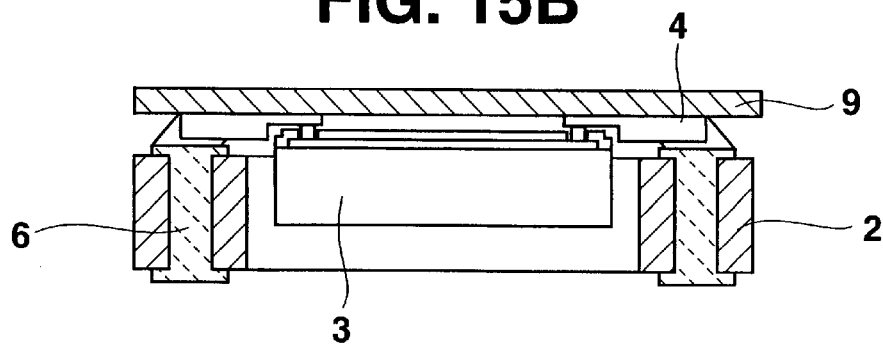

Thereafter, as a pre-treatment of resin sealing, a sealing plate 9 is attached to the surface of the semiconductor chip 3 through the lead terminals 4 as shown in FIGS. 15A and 15B.

Figure 16:
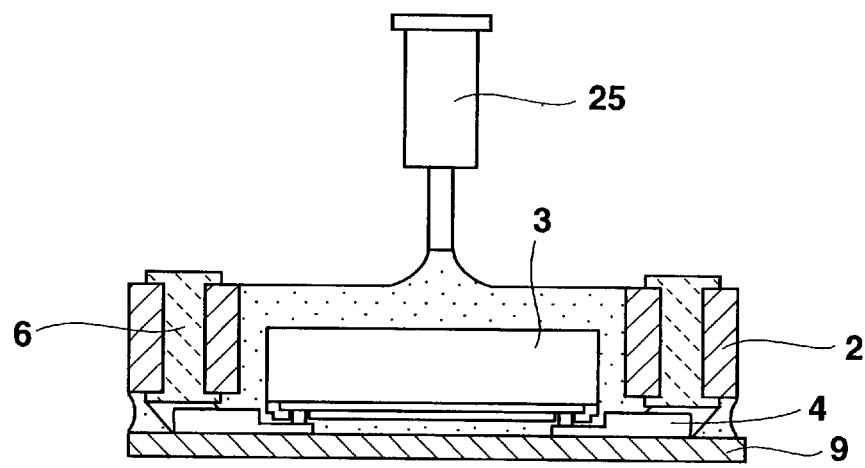
FIG. 16 is a diagram (part 2) showing the resin sealing step.

Subsequently, as shown in FIG. 16, the package substrate 2 is turned upside down, and then sealing resin 5 of low viscosity is injected from the back surface side of the semiconductor chip 3 into the package substrate 2 by a dispenser while the sealing plate 9 is used as a bottom lid. Therefore, the sealing resin 5 is filled inside the frame of the package substrate 2, and the semiconductor chip 3 mounted in the frame is sealed by the sealing resin 5. Thereafter, the sealing resin 5 is hardened to complete the semiconductor package 1 shown in FIG. 4.

Figure 17A:
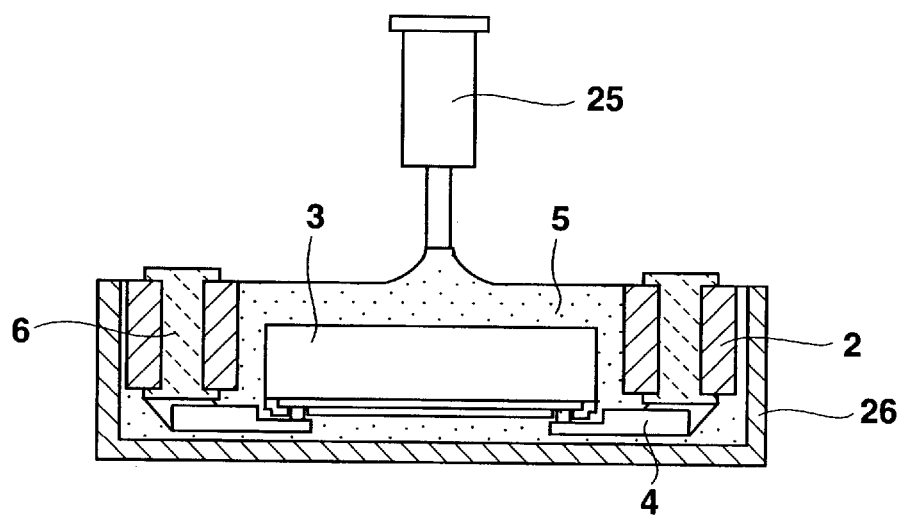
FIGS. 17A and 17B are diagrams showing another resin sealing step.
Figure 17B:
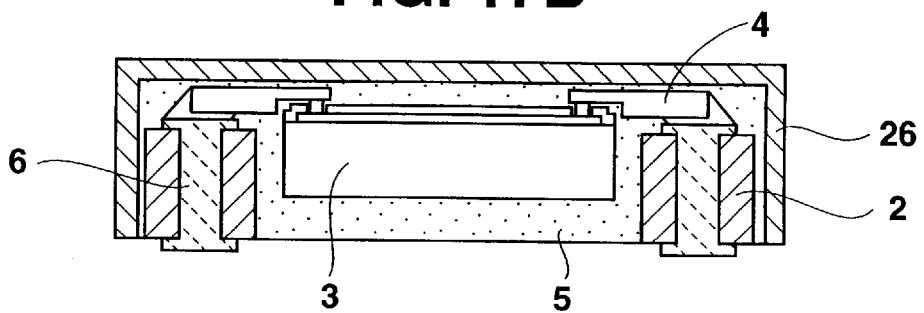

In the above-described embodiment, the sealing plate 9 is attached to the obverse surface of the semiconductor chip 3, and then the sealing resin is filled inside the frame of the package substrate in the resin sealing process. However, the following sealing process may be used in place of the above sealing process. That is, as shown in FIG. 17A, a package fabrication before resin sealing (see FIG. 14) is placed in a plastic case 26, and the sealing resin 5 is injected into the plastic case by the dispenser 25 to seal the semiconductor chip 3 with the sealing resin, thereby finally completing a semiconductor package with a plastic case 26 as shown in FIG. 17B.

Further, the following various structures may be adopted as the terminal structure of the semiconductor package.

Figure 18A:
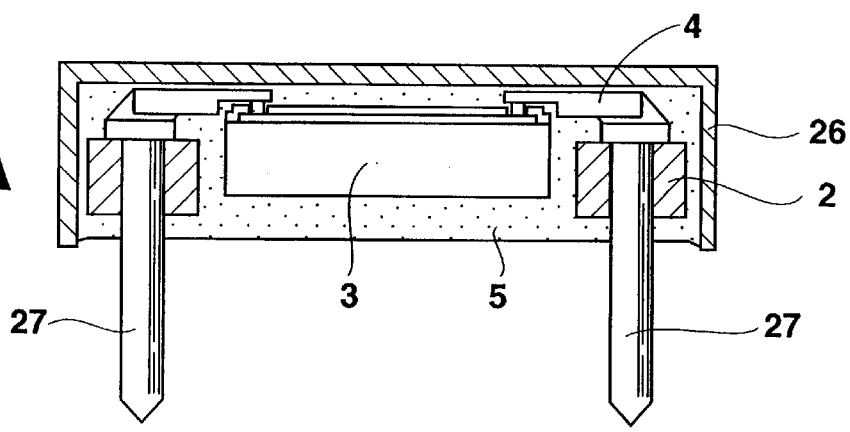
FIGS. 18A to 18D are diagrams showing a specific terminal structure.
Figure 18B:
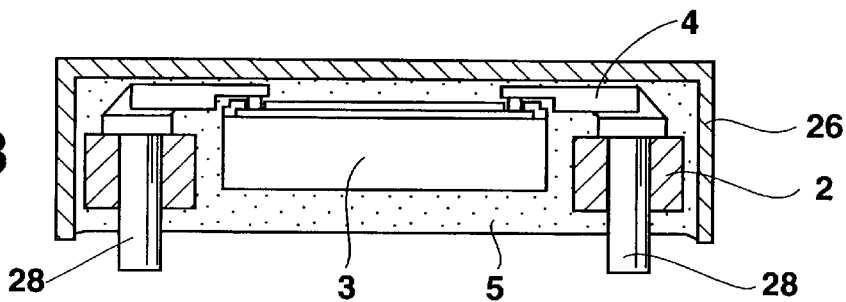
Figure 18C:
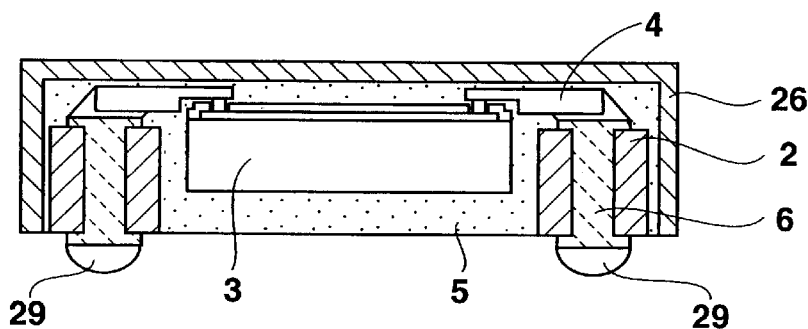
Figure 18D:
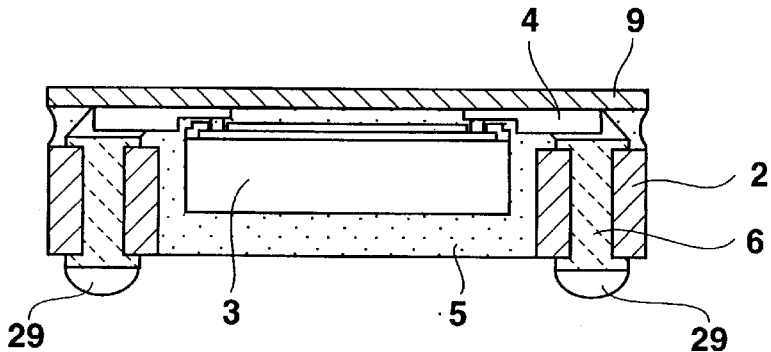

That is, as shown in FIG. 18A, longitudinal pins 27 may be implanted into the package substrate 2 to form a insertion mount type semiconductor package using the pins 27 as electrode portions for external connection. Further, as shown in FIG. 18B, short pins 28 may be implanted into the package substrate 2 to form a face mount type semiconductor package using these pins 28 as electrode portions for external connection. Still further, as shown in FIGS. 18C and 18D, in the sealing structure using the plastic case 26 or the sealing plate 9, soldering balls 29 may be formed at the end portions of the embedded through holes 6 to form a face mount type semiconductor package.

As described above, according to the semiconductor device of the present invention, the package substrate is designed in a frame shape, and the semiconductor chip is mounted (accommodated) in the frame of the semiconductor substrate. Therefore, the thickness of the package can be reduced by the amount corresponding to the thickness of the semiconductor chip, whereby the semiconductor package can be miniaturized and thinned.

Further, according to the method of manufacturing the semiconductor device of the present invention, each lead terminal is connected to each electrode pad while setting the lead connection angle in accordance with the size of the semiconductor chip, and the lead terminal is cut to a predetermined length in accordance with the electrode forming position of the package substrate. Therefore, semiconductor chips which are different in size can be installed into common package substrates with no trouble by merely changing the lead connection angle and the lead cutting length in accordance with the chip size of each type of semiconductor chip. Accordingly, the standardization of the package substrates can be performed, and the manufacturing cost of the semiconductor packages can be greatly reduced.

What is claimed is:

1. A semiconductor device comprising a semiconductor chip having a first surface with plural electrode pads along a peripheral edge portion thereof, a frame-shaped package substrate having an opening of a size greater than the size of said semiconductor chip, said substrate being thicker than the chip and, along an edge of the opening on one surface, having a plurality of electrode portions corresponding to said respective electrode pads, a lead terminal connected to each of the electrode pads of the semiconductor chip, said chip being disposed in said opening with said first surface being substantially in the plane of said one surface and the lead terminals being connected to the corresponding electrode portions of said package substrate, each of the lead terminals at an end connected to the electrode pad, having a cut-away portion so that the lead does not contact said first surface, a cover secured on said substrate to cover said one surface and the first surface of said chip and engaging the lead terminals, and sealing resin for filling all spaces in said opening and between said cover and said substrate and chip.

2. A semiconductor device according to claim 1, which has a bump at the tip of each of said lead terminals.

3. A semiconductor device according to claim 1, wherein the cover has sidewalls engaging peripheial edges of said substrate.

4. A semiconductor device according to claim 1, wherein each of the electrode portions is an end portion of an embedded through hole which has an electrode portion on a surface opposite the one surface to provide an external connection.

5. A semiconductor device comprising a semiconductor chip having a first surface with plural electrode pads along a peripheral edge portion thereof, a frame-shaped package substrate having an opening of a size greater than the size of said semiconductor chip, said substrate being thicker than the chip and, along an edge of the opening on one surface, having a plurality of electrode portions corresponding to said respective electrode pads, a plurality of lead terminals having planar upper surfaces being connected to the electrode pads of the semiconductor chip, said chip being disposed in said opening with said first surface being substantially in the plane of said one surface and the lead terminals being connected to the corresponding electrode portions of said package substrate with said planar upper surfaces being in a plane parallel to both the first surface and the one surface, a cover secured on said substrate to cover said one surface and the first surface of said chip, said cover having sidewalls engaging peripheral edges of the substrate, and sealing resin for filling all spaces in said opening and between said cover and said substrate and chip.

6. A semiconductor device according to claim 5, which has a bump at the tip of each of said lead terminals.

7. A semiconductor device according to claim 5, wherein each of the electrode portions is an end portion of an embedded through hole which has an electrode portion on a surface opposite the one surface to provide an external connection.

8. A semiconductor device according to claim 5, wherein each of the lead terminals, at an end connected to the electrode pad, has a cut-away portion so that the lead does not contact said first surface.

9. A semiconductor device comprising a semiconductor chip having a first surface with plural electrode pads along a peripheral edge portion thereof, a frame-shaped package substrate having an opening of a size greater than the size of said semiconductor chip extending through the substrate, said substrate being thicker than the chip and, along an edge of the opening on one surface, having a plurality of electrode portions corresponding to said respective electrode pads, a plurality of lead terminals having planar upper surfaces being connected to the electrode pads of the semiconductor chip, said chip being disposed in said opening with said first surface being substantially in the plane of said one surface and the lead terminals being connected to the corresponding electrode portions of said package substrate with said planar upper surfaces being in a plane parallel to both the first surface and the one surface, a cover secured on said substrate to cover said one surface and the first surface of said chip, and sealing resin for filling all spaces in said opening and between said cover and said substrate and chip.

10. A semiconductor device according to claim 9, which has a bump at the tip of each of said lead terminals.

11. A semiconductor device according to claim 9, wherein the cover has sidewalls engaging peripheral edges of said substrate.

12. A semiconductor device according to claim 9, wherein each of the electrode portions is an end portion of an embedded through hole which has an electrode portion on a surface opposite the one surface to provide an external connection.

13. A semiconductor device according to claim 9, wherein each of the lead terminals, at an end connected to the electrode pad, has a cut-away portion so that the lead does not contact said first surface.

* * * * *